United States Patent [19]

Jackson

[11] Patent Number: 4,789,862
[45] Date of Patent: Dec. 6, 1988

[54] ANALOGUE TO DIGITAL CONVERTERS

[75] Inventor: Thomas Jackson, Hanwell, England

[73] Assignee: Plessey Overseas, Limited, Ilford, England

[21] Appl. No.: 925,633

[22] PCT Filed: Feb. 21, 1986

[86] PCT No.: PCT/GB86/00093
§ 371 Date: Nov. 24, 1986
§ 102(e) Date: Nov. 24, 1986

[87] PCT Pub. No.: WO86/05048
PCT Pub. Date: Aug. 28, 1986

[30] Foreign Application Priority Data
Feb. 23, 1985 [GB] United Kingdom ............... 8504711

[51] Int. Cl.[4] ............................................ H03M 1/34
[52] U.S. Cl. ...................................... 341/155; 375/28; 341/144
[58] Field of Search ............... 332/1 D; 340/347 AD, 340/347 DA; 364/724; 375/27, 28, 29

[56] References Cited
U.S. PATENT DOCUMENTS
3,925,731 12/1975 Brainard et al. ............... 332/110 X Primary Examiner—William M. Shoop, Jr.
Assistant Examiner—Richard K. Blum
Attorney, Agent, or Firm—Michael F. Oglo; Julian C. Renfro

[57] ABSTRACT

A linear A to D converter comprising a combiner means to which an input signal to be converted is fed, the input signal being combined subtractively or additively with an analogue feedback signal, and the combiner means being arranged to feed an A to D flash converter via an amplifier, which A to D flash converter is arranged to feed a D to A converter which provides the feedback signal. The D to A converter comprises a digital overflowing accumulator also arranged to drive a finite impulse response filter having a plurality of serially coupled one bit delay elements, output signals from which are summed to provide the digital output signal.

4 Claims, 11 Drawing Sheets

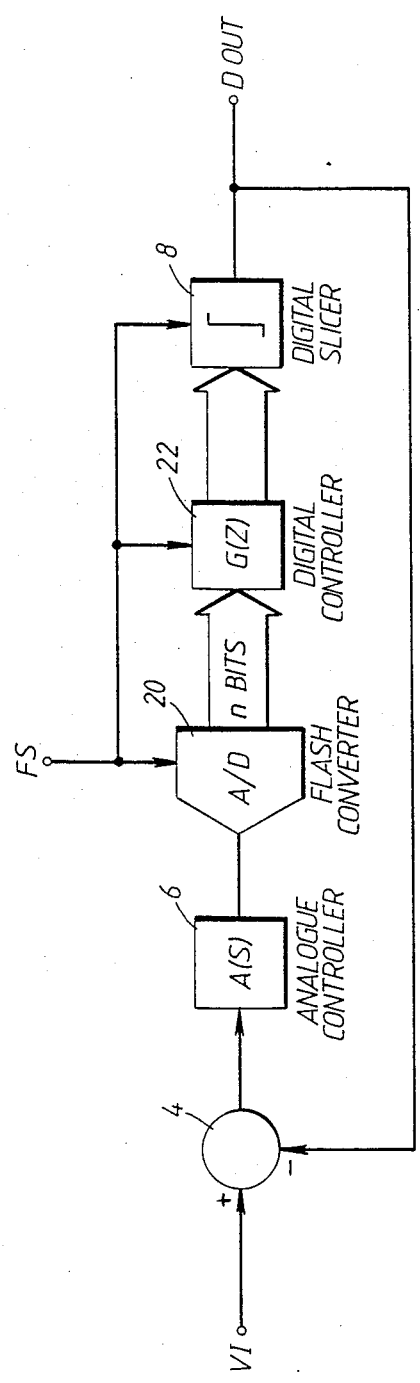
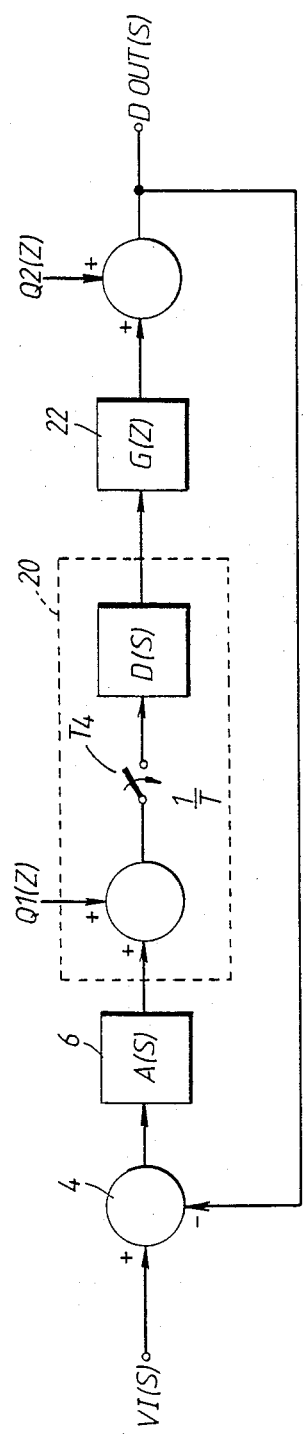
Fig. 5.
Fig. 6.

ANALOGUE TO DIGITAL CONVERTERS

BACKGROUND OF THE INVENTION

The present invention relates to analogue to digital converters.

Known interpolating analogue to digital converters usually comprise a relatively coarse resolution analogue to digital (A/D) converter arranged in a feedback loop in combination with a digital to analogue (D/A) converter; the D/A converter having much finer resolution than the coarse A/D converter. The coarse A/D converter is sampled at a high sample rate with subsequent averaging of the output samples obtained from the coarse resolution A/D converter.

The quantised signal appearing at the output of the coarse A/D converter is an approximation of the analogue signal fed to it, the approximation being dependent upon the quantum jump or step size of the quantisation and the sample rate used in the quantisation process. At any point in time, the difference between the analogue input signal and the output sample from the coarse A/D converter is known as the quantisation error; generally termed Q.

The output from the coarse A/D converter is fed to the finer resolution D/A converter, the output of which is fed back and combined with the incoming analogue input signal to be digitised. However the D/A converter utilised also gives rise to errors; generally defined by the resolution of the D/A converter.

Such interpolating A/D converters also include an analogue controller, usually in the form of a high gain amplifier of gain A, in the feed path to the coarse A/D converter.

According to the present invention there is provided an analogue to digital converter comprising combiner means for receiving an analogue input signal, an analogue controller means for receiving an output from the combiner means, a low resolution analogue to digital converter for receiving an output from the analogue controller means, a digital to analogue converter arranged in a feedback loop to the combiner means, the digital to analogue converter comprising an accumulator the output of which is arranged to drive a finite impulse response filter having a plurality of serially coupled delay elements, output signals from which are summed to provide the digital output signal and which serves also to provide the analogue feedback signal which is fed to the combiner means.

In a preferred embodiment the delay elements are one bit delay elements.

In one embodiment the combiner means is a subtractor unit, the analogue input signal being subtractively combined with the analogue feedback signal.

In another embodiment the combiner means is an adder unit, the analogue feedback signal being fed to the combiner means via an inverter and additively combined at the combiner means with the analogue input signal.

Advantageously the digital to analogue converter comprises a digital overflowing accumulator.

BRIEF DESCRIPTION OF DRAWINGS

The present invention will be described further, by way of example, with reference to the accompanying drawings in which:

FIG. 5 is a schematic block diagram of a modified analogue to digital converter;

FIG. 6 is a schematic block diagram of a sampled data model of the analogue to digital converter of FIG. 5;

SPECIFIC DESCRIPTION OF DRAWINGS

Figure 1:
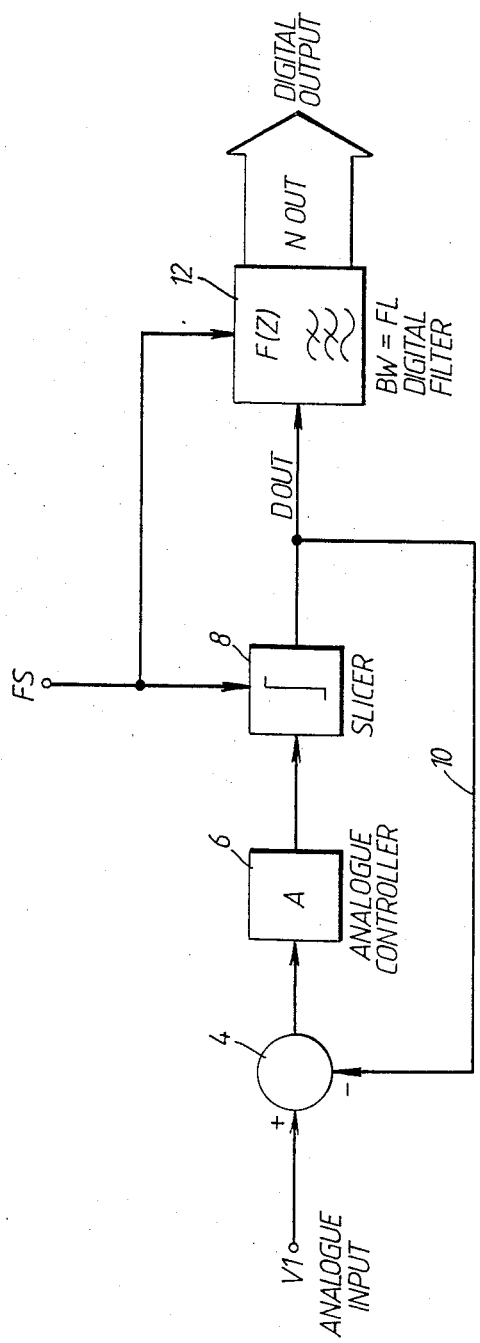
FIG. 1 is a schematic block diagram of an interpolating analogue to digital converter incorporating a one bit quantiser.

The design of interpolating A/D converters is well documented and understood. Theoretically, the greatest linearity from such a system is achieved by using a one bit quantiser as shown in FIG. 1. In FIG. 1 a combiner means 4 receives an analogue input signal $V_1$. The combiner means 4 is connected to an analogue controller means 6, the output of which is connected to a one bit quantiser in the form of slicer means 8. Feedback means is provided, in the form of a feedback control loop 10, between the output of the slicer 8 and the combiner means 4. The slicer means 8 is coupled to a digital filter 12 which provides the digital output signal.

By suitable choice of a clock rate Fs and an open looop gain A, the quantisation errors Q can be reduced to any required level. Digitally filtering the output bit stream $D_{OUT}$ in bandwidth $F_L$ produces the required number of bits $N_{OUT}$.

Figure 2:
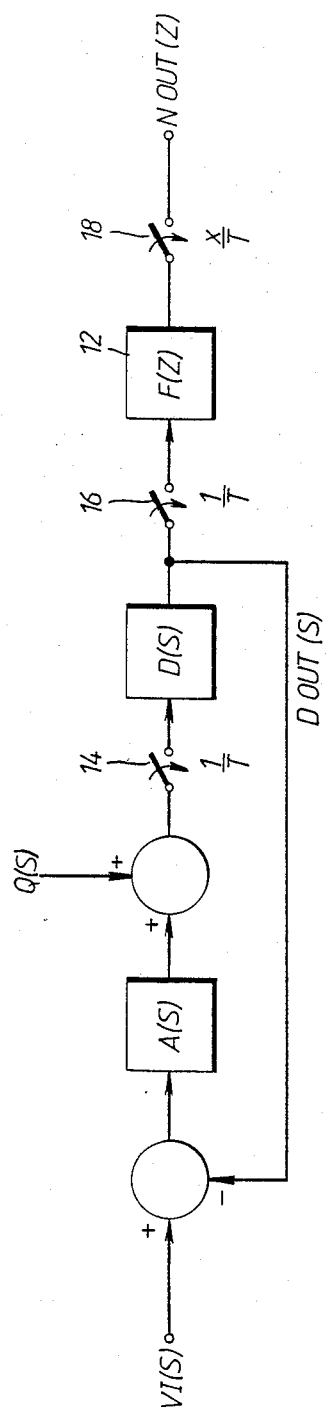
FIG. 2 is a schematic block diagram of a sampled data model of the analogue to digital converter of FIG. 1.

FIG. 2 shows a sampled data model of such a system, the model illustrating a series of sampling gates 14, 16, 18. Analysis of the model can show that the quantisation errors are reduced by increasing the open loop gain of the system. It has an optimum value when the system has a 'dead beat' closed loop response.

Figure 3:
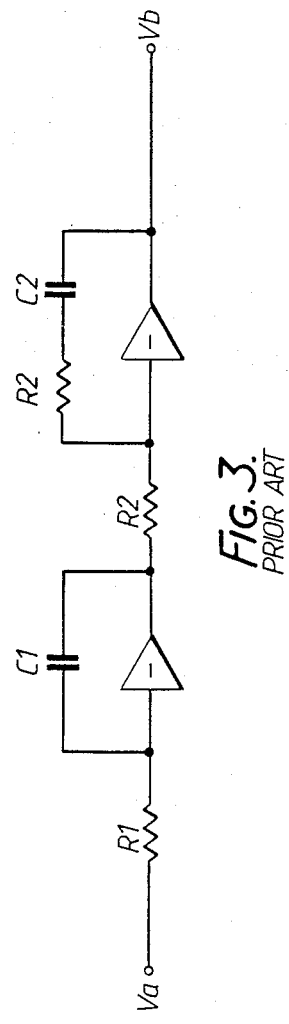
FIG. 3 is a schematic diagram of an analogue loop controller of FIG. 1.

One physical realisation of A(s) is shown in FIG. 3. The loop component values are:

$C_1 R_1 = 2T/3$ $C_2 R_2 = 3T/2$

These values will give the maximum resolution possible from a stable Type 2 second order codec.

It can also be shown that:

$$N_{OUT} = \log_2 \left[ \frac{1+V^2}{4V^2} \right] \sqrt{\frac{15 F_s}{F_L}}$$

Figure 4:
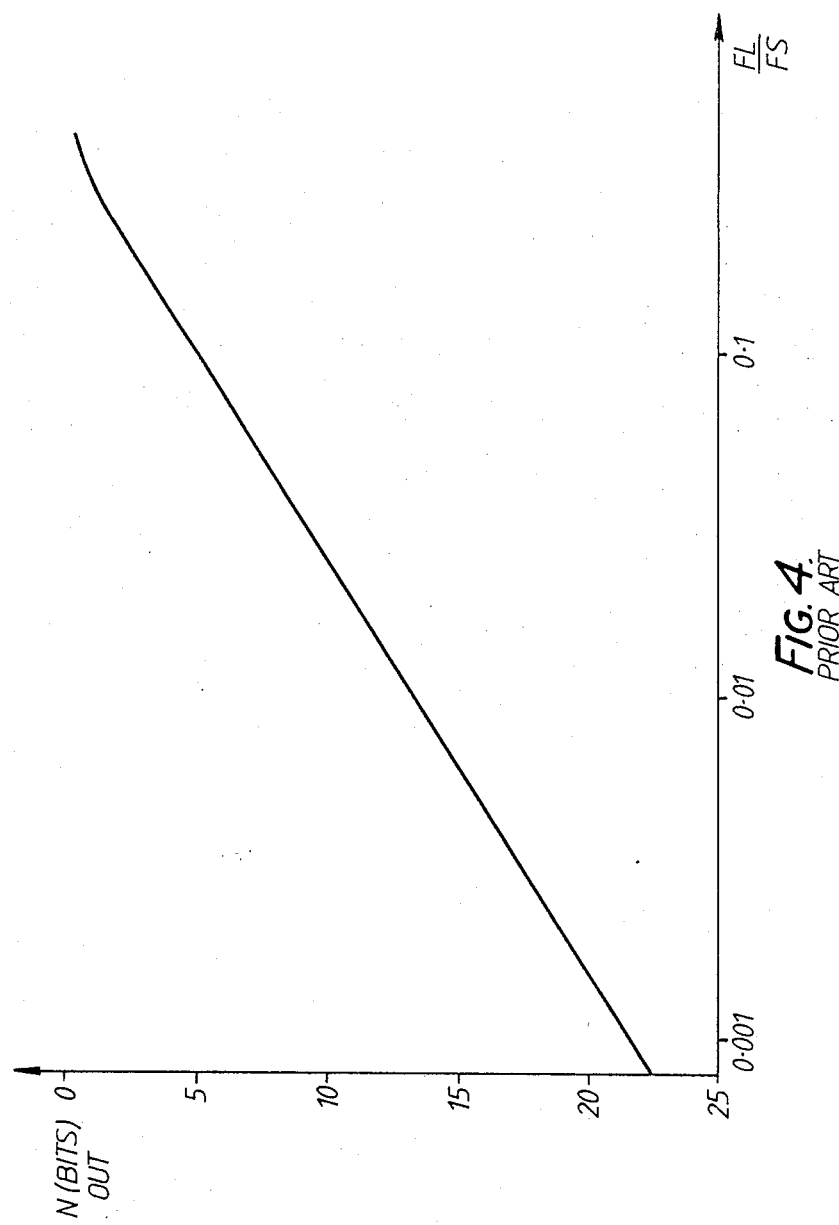
FIG. 4 is a graph of the ratio of bandwidth FL and clock rate Fs against resolution.

This expression is plotted in FIG. 4.

From FIG. 4, it appears that the maximum resolution obtainable is only limited by Fs. If a 20 bit converter is required, then the time taken for a 20 bit addition in the following digital filter will determine the maximum value of Fs. A clock pulse rate of for example 10 MHz may be used reliably. If $F_L$ is for example 10 KHz, then the resolution possible is 21.5 bits.

The component values in the loop controller will therefore typically be:

$$C_1R_1 = 6.66 \times 10^{-8}$$

$$C_2R_2 = 1.5 \times 10^{-7}$$

This means that the operational amplifiers must have bandwidths in excess of:

$$f_1 = \frac{1}{2\pi C_1 R_2}$$

$$f_1 = 2.4 \text{ MHz}$$

The maximum output swing required at $f_1$ will determine the slew rate required.

Let the output of the one bit quantiser be 5 V p-p. (i.e.: the supply rails)

$$\text{Slew rate} = \frac{dV}{dt} = 38 v/\mu s$$

With a 5 V output from the quantiser and with N=1, the spot noise is:

$$Es = \left[\frac{4V^2}{1 + V^2}\right]\sqrt{\frac{5}{30Fs}}$$

$$Es = 11.4 \, nV/\sqrt{Hz}$$

The amplifiers used must have a spot noise equal to or less than this to realise 20 bits resolution from a 5 V supply rail.

In order to have a dynamic range of 120 dB, the operational amplifiers must have a third order intercept point of 60 dBV or greater.

The minimum operational amplifier specification must be:
Bw=10 MHz
Slew rate=50 v/uS
Es=10 nV/√Hz
3rd order intercept=60 dBV All the above conditions except the linearity requirement may be met. However it is still unlikely that 20 bits resolution will be obtained. This is because with slew rate as high as 38 v/uS in the front end stages of the amplifier a lot of high frequency interpolation noise will intermodulate and produce high levels of noise below 10 KHz.

Due to this reason, no one bit converters have yet been reported in literature having exceeded 15 bits resolution, or linearity. This is inspite of theoretical predictions far exceeding measured results.

It will be shown below how these limitations due to the operational amplifiers can be overcome. A modified design approach is presented which leads to a 20 bit linear converter being implemented.

The linearity of the converter is limited by the operational amplifiers used in the analogue controller. Reducing the demand made in these amplifiers improves the overall linearity of the system.

This can be done as shown in FIG. 5. Here the signal processing is divided between the analogue controller 6 and a digital controller 22. The interface between the analogue and digital controllers is provided by a low resolution n bit A/D converter 20.

The quantisation noise of the digital slicer 8 is reduced by the digital and analogue controllers 22, 6 combined. The lower value quantisation noise of the n bit A/D converter 20 is reduced by the presence of the analogue controller 6 alone.

The noise performance of the system may be obtained from the sampled data model of FIG. 6. It can be shown that the quantisation noise Q1(z) of the A/D converter 20 is reduced by the analogue controller and the quantisation noise, Q2(z), of the digital slicer 8 is reduced by the analogue and the digital controllers combined.

Figure 7:
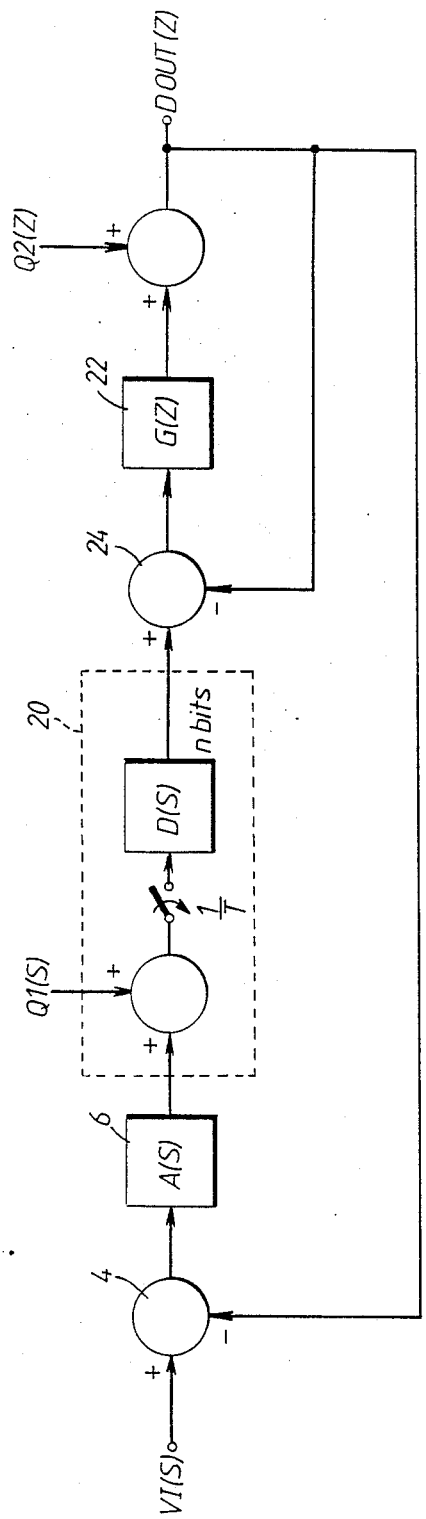
FIG. 7 is a schematic block diagram of a feedback stabilised sampled data model of FIG. 6.

The stability of the system is increased if feedback is applied around the digital controller and the slicer as shown in FIG. 7. The output $D_{OUT}$ of the slicer is fed back to a combiner means 24, the output $D_{OUT}$ being subtractively combined with the output from the flash converter 20 and the combined signal fed as an input to the digital controller 22.

The gain bandwidth product required from the analogue controller 6 is much reduced with this modified system. A system with 'dead beat' performance is therefore now not required.

Figure 8:
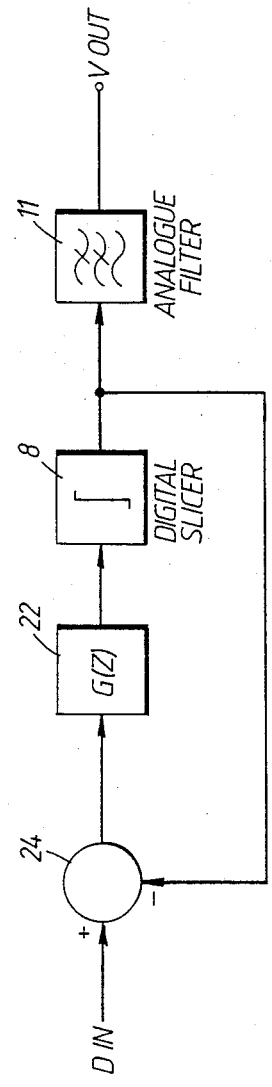
FIG. 8 is a schematic block diagram of an interpolating digital to analogue converter.

We have found that the following values would be required for a 20.5 bit converter.
$F_s$=10 MHz
$F_L$=10 kHz
n=6
A=1.5×10$^6$
b=1×10$^6$
The controller specification is now reduced to:
$f_1$=240 kHz
dv/dt=3.8 v/uS
Es=11.4 nV/√Hz Applying feedback around the digital controller and the one bit slicer produces an interpolating D/A converter as is shown in FIG. 8. The system limit cycles to produce an output bit stream Do, which has a mean mark to space ratio proportional to the digital input word D1.

If this bit stream is fed into a one bit analogue FIR filter 11, then intermediate voltage levels are obtained at Vo. The number of intermediate values depends on the FIR filter resistor weightings and the characteristics of the digital controller 22.

Combining the interpolating D/A converter with the analogue FIR filter 11 produces a D/A converter which is absolutely linear. Any mismatching between the resistor taps produces a DC offset at the origin. The resulting transfer function is therefore shifted and not deformed as in the case of conventional D/A converters. This is because each resistor in the analogue FIR filter 11 implementation is used in turn instead of just once, as in the case of conventional ladder network D/A converters.

Figure 9:
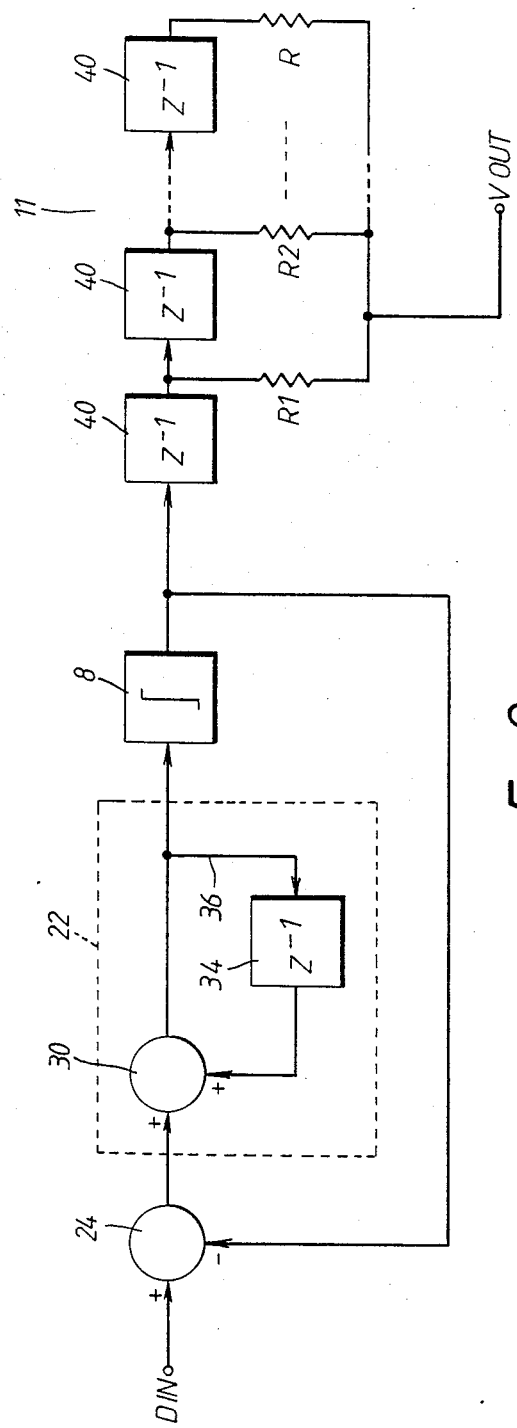
FIG. 9 is a schematic block diagram of a type 1 interpolating digital to analogue converter.

An example of such a D/A converter is shown in FIG. 9. The output from the combiner means 24, which is in the form of a subtractor, is fed to a further combiner means, in the form of an adder 30 of the digital controller 22. The output from the adder 30 is fed both to the slicer 8 and via a one bit delay stage 34 in a feedback line 36 to the adder 30. The output from the slicer 8 is fed to the analogue filter 11. As this is a Type 1 system, the parallel resistors $R_1 r_2 - - - R_x$ in the FIR filter 11 are all equal, the blocks 40 being one bit delay stages.

The number of possible output levels is:
L=x+1
where x=number of delayed taps.

Figure 10:
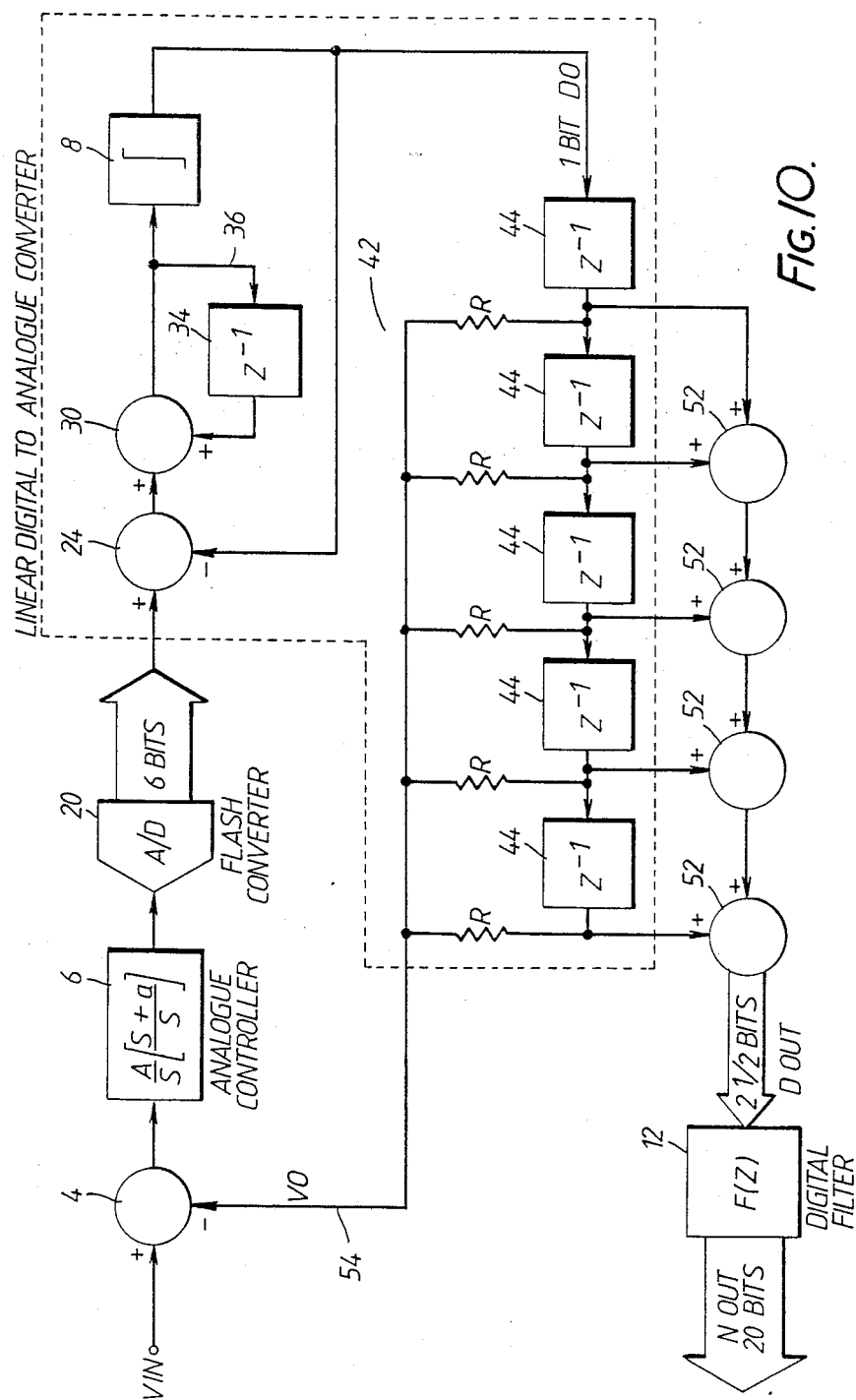
FIG. 10 is a schematic block diagram of a linear analogue to digital converter according to an embodiment of the present invention; and, FIG. 11 is a schematic block diagram of a low pass third order digital filter used in the analogue to digital converter of FIG. 10.

A modified version of the complete interpolating D/A converter with five taps is incorporated into the converter. This produces four more intermediate values at the intput to the analogue controller 6 and therefore reduces the slew rate requirement of the operational amplifiers by five. This is because the maximum step size into the controller is reduced by five. FIG. 10 shows the block diagram of the complete system of one embodiment of the analogue to digital converter.

Reference numerals with respect to similar features described in earlier figures have been retained the same. The linear digital to analogue converter is provided in its first stage with components performing as a digitally overflowing accumular which drive a finite impulse response filter 42 comprising a plurality of serially arranged one bit delay stages 44 and a plurality of parallel arranged resistors R. Taps from the filter 42 are fed to combiner means 50 in the form of a plurality of serially arranged adders 52.

The output voltage Vo from the filter 42 is fed along a line 54 to the combiner means 4 which is a subtractor unit, the analogue input signal being subtractively combined with the analogue feedback voltage Vo. If an inverter (not shown) is incorporated in the line 54 then the combiner means 4 would need to take the form of an adder.

The analogue controller specification required is now:
$f_1$=240 kHz
dv/dt=0.76 V/uS
Es=11.4 nV/$\sqrt{Hz}$ The required analogue controller specification is:
A=1.5×$10^6$
b=$10^6$
dv/dt=0.76 v/uS
Es=11.4 nV/$\sqrt{Hz}$
where
$F_s$=10 MHz
$F_L$=10 kHz The gain distribution within the analogue controller has also been modified so that the demands made upon the input stages are minimal. Resistive frequency compensation is also used. The non linearities introduced by the analogue controller are therefore very much reduced.

The output bit stress, $D_{OUT}$, of the converter needs to be filtered in a 120 kHz bandwidth in order for the possible resolution of over 20 bits to be realised.

Figure 11:
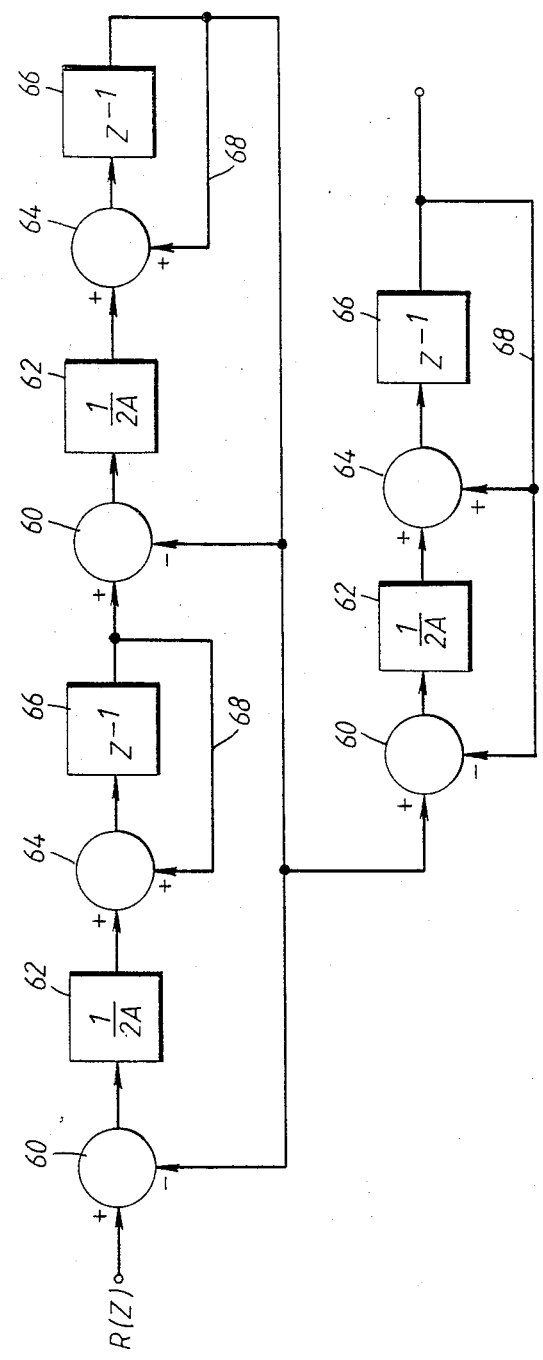

The filter is shown in FIG. 11 and comprises three stages in series arrangement. Each stage comprises a combiner means, in the form of a subtractor 60, connected to a multiplier 62 having a feed forward coefficient with an inverse multiple of 2. The multiplier 62 is connected to an adder 64 the output of which is connected to a one bit delay 66 whose output is fed back to the adder 64 along a feedback line 68. A third order filter is required to achieve this resolution because the quantisation noise spectrum of $D_{OUT}$ rises with a second order slope with increasing frequency.

The low pass digital filter shown in FIG. 11 produces the required resolution without the need for any multiplications. This is because the feed forward coefficient is always an inverse Multiple of 2.

The filter cutoff frequency is:

$$fc = -\frac{F_s}{2\pi} \ln\left[1 - \frac{1}{2^A}\right]$$

Table A shows the possible resolution of the complete A/D converter using this lowpass digital filter. It is assumed that the final output, $N_{OUT}$, is resampled at 10 Fc.

TABLE A

| $F_c$ (kHz) | A | $N_{OUT}$ |
|---|---|---|
| 6.23 | 8 | 22.2 |
| 12.48 | 7 | 19.7 |
| 25.06 | 6 | 17.2 |
| 50.53 | 5 | 14.7 |
| 102.7 | 4 | 12.4 |

The A/D converter of the present invention overcomes the linearity problems associated with known interpolation feedback A/D converters by the finite impulse response filter serving to reduce the slew rate demands on the amplifiers in the analogue controller.

The novel IIR digital decimation filter of FIG. 11 is programmable and easily implemented.

Together, the converter and the decimation filter produce a simple and cheap A/D converter which has better linearity and resolution than known A/D converters.

Although the present invention has been described with respect to a particular embodiment, it should be understood that modifications may be effected within the scope of the invention.

We claim:

1. An analogue to digital converter comprising first combiner means for receiving an analogue input signal, an analogue controller means for receiving an output from the first combiner means, a low resolution analogue to digital converter for receiving an output from the analogue controller means, a digital to analogue converter arranged in a feedback loop to the first combiner means, the digital to analogue converter comprising second combiner means for receiving a digital input from the low resolution analogue to digital converter, digital controller means for receiving an output from the second combiner means, digital slicer means for receiving an output from the digital controller means, feedback means for affording the output of the digital slicer means to the second combiner means and a finite impulse response filter connected to be driven by the output of the digital slicer means, the finite impulse response filter having a plurality of serially coupled delay elements, output signals from which are summed to provide the digital output signal and which serves also to provide the analogue feedback signal which is fed to the first combiner means.

2. An analogue to digital converter as claimed in claim 1 wherein the delay elements are one bit delay elements.

3. An analogue to digital converter as claimed in claim 1 wherein the first combiner means is a subtractor unit, the analogue input signal being subtractively combined with the analogue feedback signal.

4. An analogue to digital converter as claimed in claim 1 wherein the first combiner means is an adder, the analogue feedback signal being fed to the adder via an inverter to be additively combined with the analogue input signal.

\* \* \* \* \*